Feb. 3, 1959 H. KIHN 2,872,579

FREQUENCY CONTROL

Filed March 1, 1955 3 Sheets-Sheet 1

INVENTOR.
HARRY KIHN
BY J. L. Whittaker
ATTORNEY

Feb. 3, 1959 H. KIHN 2,872,579

FREQUENCY CONTROL

Filed March 1, 1955 3 Sheets-Sheet 2

INVENTOR.
HARRY KIHN
BY
ATTORNEY

Feb. 3, 1959 H. KIHN 2,872,579

FREQUENCY CONTROL

Filed March 1, 1955 3 Sheets-Sheet 3

INVENTOR.
HARRY KIHN
BY J. L. Whittaker
ATTORNEY

United States Patent Office 2,872,579

Patented Feb. 3, 1959

2,872,579

FREQUENCY CONTROL

Harry Kihn, Lawrenceville, N. J., assignor to Radio Corporation of America, a corporation of Delaware Application March 1, 1955, Serial No. 491,306

11 Claims. (Cl. 250—36)

The present invention relates to a frequency control arrangement and in particular to an improved system for automatically controlling the frequency of a source of pulsed radio frequency energy.

Systems are known in which sideband frequencies are utilized to control the frequency of a radio frequency oscillator. In accordance with one such system, the carrier frequency of a continuous microwave oscillator is modulated by another source of oscillations to produce a pair of sideband frequencies on respective opposite slopes of the molecular resonance characteristic of a particular type of gas. In their passage through the gas, this single pair of sideband frequencies is differentially varied in amplitude and phase in accordance with the sense and extent of the deviation of the oscillator from its desired operating frequency. The resulting difference in amplitude or phase of the sideband frequencies is utilized to vary the frequency of the microwave oscillator to compensate for its deviation.

The instant invention involves a different problem and solution than heretofore encountered in such continuous wave systems, namely to stabilize a source of pulsed rather than continuous radio frequency waves. The present invention, for example, is particularly useful in narrow pulse systems where ordinary means of AFC (automatic frequency control) would require amplifiers having a bandwidth of several hundred megacycles and there would be the possibility of pickup of pulse video components. The pulse source, for example, may be the difference frequency between the signals from a pulsed magnetron and a continuous wave klystron. The output of the magnetron and therefore the resultant difference frequency between the magnetron output and the klystron output consists of a microwave energy spectrum including a center frequency and pluralities of higher and lower sideband frequencies rather than single upper and lower sideband frequencies. This spectrum may be several hundred megacycles wide and there may be thousands of discrete sideband frequencies, the number, amplitudes and frequencies of the side bands depending upon the carrier radio frequency, the pulse shape, the pulse width and the pulse repetition frequency.

According to the invention, this microwave frequency spectrum is passed through a network having a double selectivity curve, each curve encompassing a frequency band substantially narrower than the microwave energy spectrum. One of the selectivity curves occurs on one side of the pulse center frequency and the other on the opposite side thereof.

If the spectrum is symmetrical, the curves are equally spaced from the center frequency and if asymmetrical the curves are unequally spaced from the center frequency. In both cases, the spacing is such that when the pulsed radio frequency source is "on frequency," the network passes sidebands of the same amplitude and when the source drifts the networks pass sidebands of unequal amplitude. The frequency control circuit includes means, such as a discriminator and difference amplifier, responsive to the two outputs of the network for deriving a control signal for compensating for any frequency deviation of the pulsed radio frequency source.

In a preferred form of the invention the network providing double selectivity curves comprises overcoupled amplifier means. The degree of overcoupling is sufficient to provide an output characteristic comprising two distinct selectivity curves separated by a center zero output region.

In said preferred form of the invention the detector which is connected to receive the output of the overcoupled amplifier stage is gated during the pulse interval. This adjusts the discriminator tubes to the optimum point for detection during the pulse interval but allows them to be driven well below cutoff during the remainder of the pulse cycle. An important advantage of the arrangement is that drift due to variation in operating parameters is greatly reduced. Such drift between pulse intervals seriously affects the stability of the pulsed radio frequency source.

The invention will be described in greater detail by reference to the following description taken in connection with the accompanying drawing in which.

Throughout the figures similar reference numerals refer to similar elements.

Figure 1:
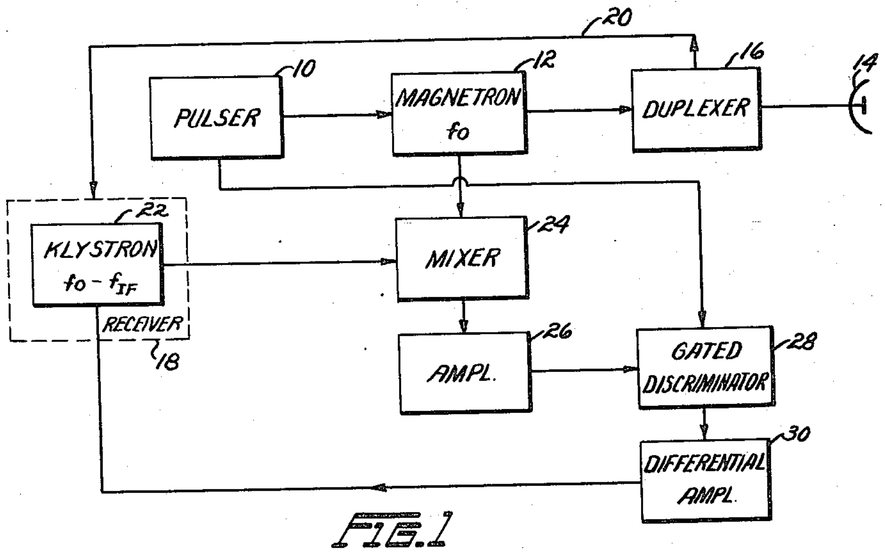
Figure 1 is a block circuit diagram of an automatic frequency control system according to the invention.

Referring now to Figure 1, pulser 10 applies trigger pulses to magnetron 12 which in turn supplies energy to antenna 14 through duplexer 16. In one embodiment of the invention the pulses supplied by the pulser are on the order of 0.3 microsecond in duration. However, the invention is, of course, applicable to more conventional systems using pulses of larger duration. The duplexer 16 may include directional coupling means or transmit-receive devices. Its function is to prevent the transmitted energy from being applied to the receiver 18 as is well known in the art. Since such circuits are conventional, the duplexer will not be described in further detail.

The echo pulses received by antenna 14 are applied via lead 20 to receiver 18 shown by a dashed block. Since the only element in the receiver of interest in the present invention is its local oscillator, klystron 22, it is shown as a solid block within the receiver. The remainder of the receiver elements play no part in the present invention and, therefore, will not be discussed in further detail.

Figure 2:
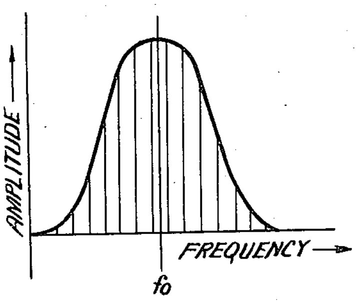
Figure 2 is a sketch of the frequency spectrum of a radio frequency pulse source.

The continuous wave output of klystron 22 and the pulsed output of magnetron 12 are applied to mixer stage 24 to obtain an intermediate frequency wave. The magnetron output consists of a center frequency and pluralities of sideband frequencies on opposite sides of said center frequency such as shown in Figure 2. The amplitudes and frequencies of the sidebands depend, of course, on the shape of the trigger pulse from pulser 10, the width of the trigger pulse and the pulse repetition frequency of said trigger pulse. The resultant output of mixer 24, although of a substantially lower frequency than the magnetron frequency, also includes sidebands and its spectrum is similar to the one shown in Figure 2.

Figure 4:
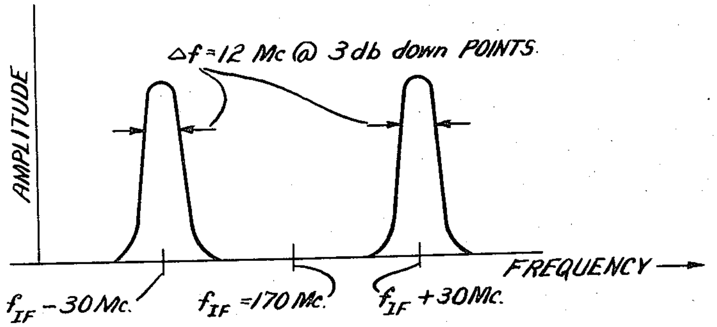
Figure 4 is a graph of the double selectivity curve of the amplifier shown in block form in Figure 1.

The above resultant wave is applied to amplifier stage 26 which in a preferred form of the invention is an overcoupled amplifier having a double selectivity curve characteristic as shown in Figure 4. The details of this circuit will be explained more fully below. Amplifier 26 is tuned so that the two curves occur on opposite sides of the center beat frequency $f_{IF}$ between the magnetron and klystron. Thus, only the sideband frequency components occurring within these curves are amplified by amplifier 26 and pass to discriminator circuit 28.

For reasons which will be outlined more fully below the discriminator 28 is gated by the same 0.3 microsecond pulses applied to the magnetron. The discriminator compares the amplitudes of the sidebands amplified by amplifier 26 and, when they are different, applies a resultant signal to differential amplifier 30. This resultant signal is amplified by the differential amplifier and applied to the klystron to control its center frequency $f_0—f_{IF}$. The overall result of the arrangement is that the difference frequency (including sidebands) between the magnetron and klystron is maintained constant.

Figure 5:
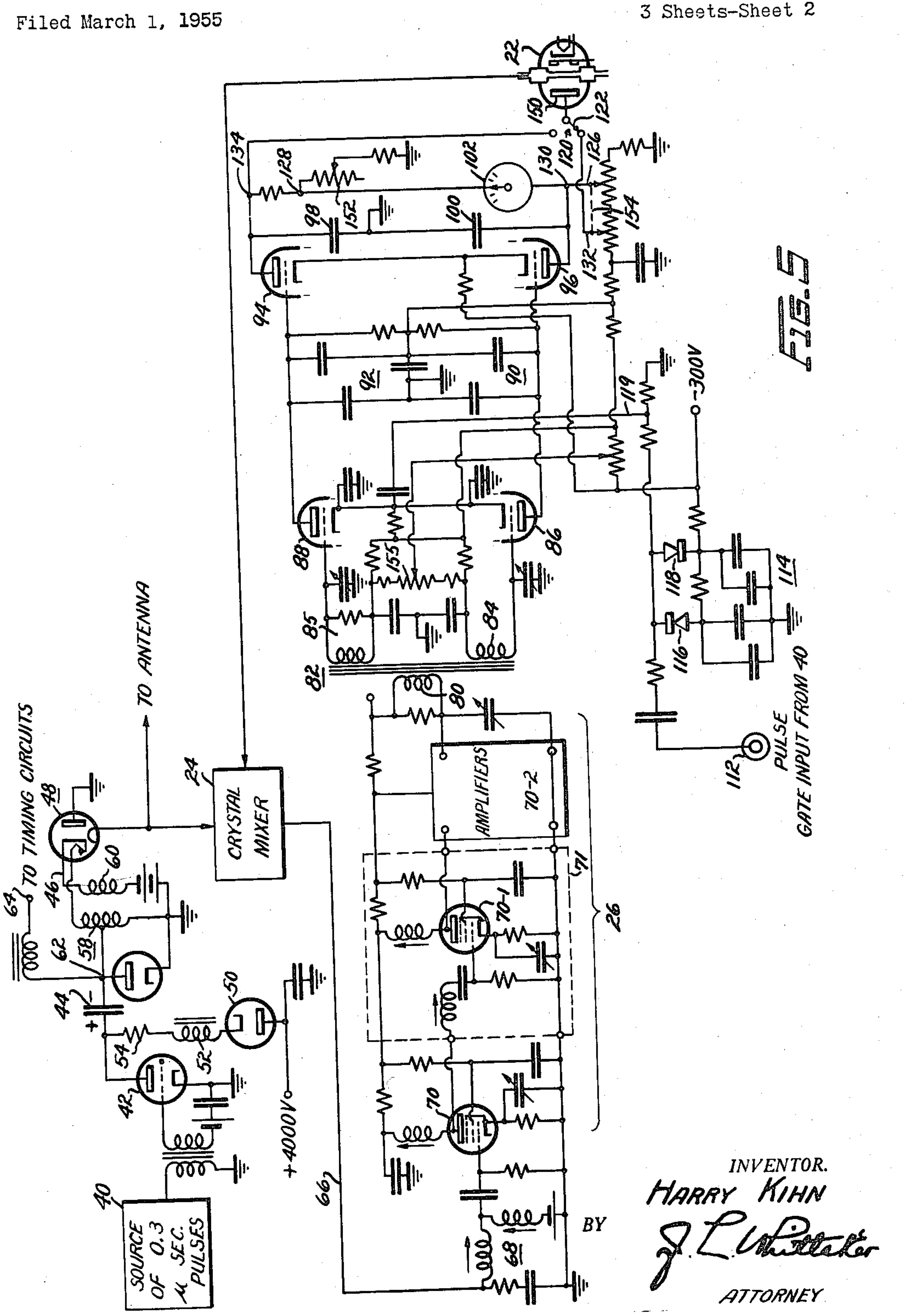
Figure 5 is a diagram partially in block form and partially in schematic form of the system shown in Figure 1.

Details of the block diagram of Figure 1 are shown in Figure 5. Pulser 10 includes a source of 0.3 microsecond pulses 40 triggering a gas-filled tube 42 such as a hydrogen-filled thyratron. The latter is in the discharging path of storage condenser 44 and permits the condenser to apply an extremely high negative pulse to the cathode 46 of magnetron 48 as will be explained more fully below. Source 40 may include a gas tube trigger circuit such as the one to be explained more fully below having a tuned discharging circuit such that one half cycle of its output is equal to about 0.3 microsecond.

During the interval between pulses capacitor 44 is charged through the circuit including diode 50, resonant charging choke 52, resistor 54, charging capacitor 44, and the lower portion of auto-transformer 58. In a manner well known in the art, resonant choke 52 permits a charge to be built up on capacitor 44 with polarities as indicated which is double that of the D. C. voltage source. In brief, the charge corresponds to approximately the maximum peak amplitude of the first half cycle of the wave to which the resonant circuit including choke 52 is tuned. Diode 50 prevents the tuned circuit from swinging in the opposite direction and thereby maintains the capacitor at its peak value. The thyratron 42 is now in condition to be fired.

Upon the application of a positive pulse to the control grid of the thyratron of sufficient amplitude to overcome the negative bias normally applied thereto, the latter fires. This permits condenser 44 to discharge. The discharge path includes thyratron 42, ground, and the lower half of auto-transformer 58. The discharge circuit including the auto-transformer and the distributed parameters associated therewith is tuned to a relatively high frequency of about 20 mc. Thus, one half cycle of this frequency is equivalent to approximately 0.025 microsecond. Magnetron 48, however, is not driven into oscillations until the cathode voltage thereof attains greater than a predetermined amplitude. This occurs for a duration of time approximately slightly under 0.02 microsecond and the resultant magnetron output at the 3 db downpoint is approximately 0.01 microsecond in duration.

The function of damper diode 56 is to cut off the positive swing of the oscillations of the tuned capacitor discharge circuit thus dissipating any residual stored energy on the capacitor which might cause double firing of the magnetron. The resultant pulse applied to the magnetron cathode may be thought of as a single, negative-going pulse.

The function of auto-transformer 58 is to step up the pulse amplitude. The second coil 60 shown adjacent the auto-transformer 58 isolates the cathode of the magnetron from ground. In one embodiment of the invention, coils 58 and 60 consist of a length of coaxial cable wound into a helix, the inner conductor of the cable comprising coil 60 and the outer conductor thereof coil 58.

In a preferred form of the invention the pulses from source 40 may occur at an asynchronous rate or be time modulated either in a regular or irregular manner. The magnetron output pulse does not occur at precisely the same time interval after the leading edge of the 0.3 microsecond pulse from pulse to pulse due to inherent instability of thyratron 42. Therefore, if source 40 were used to trigger the timing circuits of the radar system there would be some jitter in the displayed echoes. In order to avoid this difficulty, the pulse actually applied to the magnetron cathode is employed to synchronize the timing circuits. This pulse is taken from point 62 in the circuit and is available at terminal 64.

The output of the magnetron is applied to the antenna and a small portion of the output applied to mixer 24 which is preferably a crystal mixer. The output of klystron 22 is also applied to the mixer 24. In one form of the invention both said outputs are in the 35,000 mc. range and waveguides are employed for leads between the klystron and the mixer and the magnetron and the mixer. In this form of the invention the intermediate frequency is 170 mc.

The output of the crystal mixer is applied through a coaxial line 66 and a wide band impedance matching circuit 68 to the overcoupled amplifier stage 26. In one embodiment of the invention stage 26 consists of six pentode stages two of which, 70 and 70–1, are shown in schematic form and the other four of which, 70–2, are shown in block form. The four amplifiers included in block 70–2 are identical to the amplifier shown in the dashed box 71.

The coupling between stages is such that the resultant selectivity curve of the amplifier consists of two curves as shown in Figure 4. It will be noted that the curves are equally spaced on opposite sides of the 170 mc. intermediate frequency. Each curve is approximately 12 mc. wide at the 3 db down point. In the preferred form of the invention the curves occur at the points in the frequency spectrum of the intermediate frequency pulses where slope $dA/df$ multiplied by amplitude is a maximum, where $A$=amplitude, and $f$=frequency. In other words, the dual curves occur in the areas $\Delta f$ shown in Figure 3. On the other hand, if the spectrum is regular, the double curves may occur at points in the spectrum where the slope $dA/df$ is maximum. $dA/df$ is displaced slightly from $$\frac{AdA}{df}$$

In one embodiment of the invention, wherein the pulses were of 0.01 microsecond duration and the pulse repetition frequency about 15 kc., the centers of the curves were spaced about 30 mc. above and below the intermediate frequency as shown in Figure 4.

Figure 3:
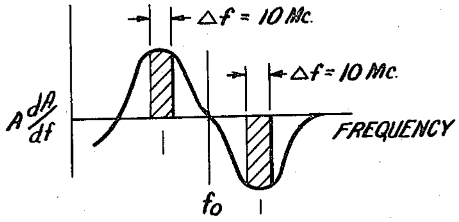
Figure 3 is a graph of the first derivative times amplitude of the curve envelope shown in Figure 2.

Although in the example illustrated in Figs. 2 and 3 the sidebands are symmetrical, the invention is equally applicable to asymmetrical pulse spectrums. The latter might result, for example, from undesirable frequency modulation components. In such case, the amplifier stages would be designed to have a double selectivity curve, each component of which was unequally spaced from the pulse center frequency. The curves would, however, be so spaced that when the source (pulsed I. F.) was on frequency, the selectivity curves would pass sidebands of equal amplitude.

The output of the overcoupled amplifier is applied to the primary winding 80 of transformer 82. This primary winding is broad banded and tuned to a center frequency of 170 kc. The secondary windings 84 and 85 of transformer 82, on the other hand, are narrow banded and tuned to frequencies of 140 and 200 mc. respectively. Preferably each secondary winding has a bandwidth of approximately 15 mc. to insure that the entire amplifier output is received. Transformer 82 comprises the input to discriminator stage 28. Winding 84 feeds the control grid of triode 86 and winding 85 feeds the control grid of triode 88. The plate circuits of triodes 86 and 88 include RC integrating networks 90 and 92 respectively for stretching the output pulses of the discriminator.

The stretched output pulses from discriminator 28 are applied to balanced differential amplifier 30 which includes triodes 94 and 96 and integrating output condenser 98.

In the operation of stages 28 and 30 per se, as described so far, sidebands of equal amplitude applied to the discriminator and differential amplifier stages result in a D. C. control voltage output of zero. This indicates that the klystron is on frequency relative to the magnetron and that the intermediate frequency is of the proper value. When, however, the intermediate frequency changes, the sidebands also shift either in one direction or the other. When this occurs, the relative amplitudes of the two sidebands change and there results a D. C. output from stage 30 which is applied to the klystron reflector to tune the klystron. The frequency output of the klystron is changed in the proper sense and by the proper amount to again render the selected sideband frequencies of the same amplitude, which indicates that the klystron is again at the proper operating frequency relative to the magnetron.

In operation of the discriminator circuit it was found that the klystron frequency could not be maintained sufficiently stable. The reason, it was discovered, was discriminator drift during the periods between pulses. The sampled pulse energy 110 (Fig. 6) is very small due to the 0.01 microsecond pulse width. Even though stretched to approximately 0.1 microsecond by the dual frequency amplifier bandwidth, the active duty cycle is still small compared to the time off of the magnetron pulse. In one embodiment of the invention, for example, the time on to time off ratio of the system was about $1.5\times10^{-3}$ seconds. It was discovered that during the time off interval the discriminator circuit was subject to drift. This is because the triode, in normal operation, is biased only slightly above cutoff (dashed line 111, Fig. 6) to enable plate detection to take place and in this biasing region the tube characteristic is asymptotic in the microampere region. The residual current (somewhat emphasized in Fig. 6) in the cutoff region is subject to drift due to heater and plate voltage variations of the discriminator. Since the off interval is so long and since the energy during the on interval is relatively small, this current drift causes substantial errors in the resultant D. C. output voltage of amplifier 30 used to tune the klystron.

One might think that the above difficulty could be overcome by biasing discriminator 86 and 88 well below cutoff and supplying R. F. (radio frequency) pulses 110 of greater amplitude. However, this would require an increase in pulse amplitude of about 3 to 1 and such operation is extremely difficult with effective 20 mc. amplifier bandwidths and the small pentodes used as the overcoupled 170 mc. amplifiers.

Figure 6:
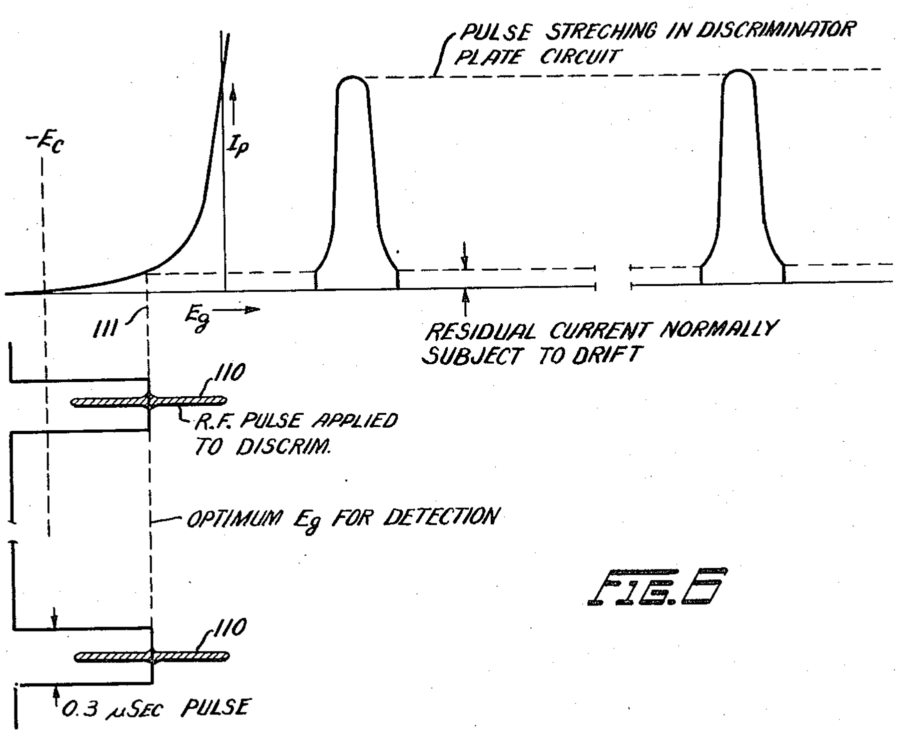
Figure 6 is a graph of the discriminator performance.

The problem is solved according to the invention by applying the 0.3 microsecond pulses to gate the discriminator. The discriminator is normally maintained well below cutoff ($-E_c$). However, during the gating interval the grid voltage is raised to the optimum point for plate detection. This type of operation is illustrated in Figure 6.

Referring again to Figure 5, the gate pulse is applied from pulser 10 to terminal 112 through a pulse-shaping circuit 114 and lead 119 to the interconnected cathodes of triodes 86 and 88. The pulse-forming circuit includes a pair of diodes 116 and 118 which are so biased that the uneven top as well as the broader base portion of the pulse is eliminated. The uneven top is due to spurious transients occasioned by thyratron firing. The resultant pulse is substantially square as shown in Figure 6.

In operation of the system according to the invention, switch 120 (Fig. 5) is first thrown to the lower position as shown in the drawing. This connects the repeller electrode 150 of the klystron to a source of direct negative potential. The klystron 22 is then mechanically tuned as, for example, by adjusting the dimensions of its cavity, until targets of maximum intensity appear on the radar oscilloscope (not shown). The klystron is then electrically tuned by adjusting potentiometer arm 132 to obtain maximum mixer crystal 24 current. The two steps above are then repeated in the order named to obtain optimum klystron output. During this initial tuning procedure no control signals are applied to the gated discriminator.

Switch 120 is then thrown in the upper position, that is, arm 122 in contact with fixed contact 124. There is still no signal applied to the gated discriminator. Potentiometer arm 126 is then adjusted to obtain the same current through mixer crystal 24 as when arm 132 was adjusted. This means that point 134 in the circuit is at the same potential as arm 132. Now, the movable arm of zero adjust potentiometer 152 is adjusted to make tuning indicator meter 102 read zero. The circuit is then properly adjusted and when a control signal is applied to the gated discriminator it will maintain the klystron on frequency. If at any time fine adjustment of balance is required, differential bias potentiometer 155 may be employed.

In a preferred form of the invention potentiometer arms 126 and 132 are ganged for simultaneous adjustment. This is shown by dashed line 154.

In operation of the system of the invention, the klystron frequency is maintained stable to within 3 to 5 mc. in 35,000 mc. over extremely long periods of time.

What is claimed is:

1. A frequency control arrangement comprising, in combination, a source providing radio frequency pulses having a center frequency and pluralities of sideband frequencies on opposite sides of said center frequency; means coupled to said source for equally amplifying solely certain of said sideband frequencies on opposite sides of said center frequency equally spaced from said center frequency; and means coupled to said last-named means and to said source for deriving from said amplified sideband signals a control signal for controlling the frequency of said source.

2. A frequency control arrangement comprising, in combination, a source providing radio frequency pulses the frequency spectrums of which include a center frequency and pluralities of sideband frequencies on opposite sides of said center frequency; circuit means having a passband defined by two discrete selectivity curves, each substantially narrower than the frequency spectrum of the radio frequency pulses, one occurring on one side of said center frequency and the other being equally spaced from said center frequency and occurring on the opposite side thereof, said circuit means being coupled to said source for passing solely the sideband frequency components of said pulses occurring within said selectivity curves; and control circuit means coupled to said circuit means and to said source for deriving from the output of said circuit means a control signal for controlling the frequency of said source.

3. A frequency control circuit as set forth in claim 2, said pair of selectivity curves occurring in the region of the frequency spectrum of said radio frequency pulses wherein the change in amplitude with frequency of said sidebands is the greatest.

4. A frequency control circuit as set forth in claim 2, wherein said circuit means comprises overcoupled amplifier means.

5. A frequency control arrangement comprising, in combination, a pulsed radio frequency oscillator; a continuous wave radio frequency oscillator; means coupled to said two oscillators for combining their outputs to obtain difference frequency pulses, said difference frequency pulses having a spectrum which includes a center frequency and pluralities of sideband frequencies on opposite sides of said center frequency; bandpass amplifier means having a passband defined by two discrete selectivity curves, each substantially narrower than the frequency spectrum of said difference frequency pulses, one occurring on one side of said center frequency and the other being equally spaced from said center frequency and occurring on the opposite side thereof, said amplifier means being coupled to said combining means for passing solely the sideband frequency components of said pulses occurring within said selectivity curve; and control circuit means coupled to said amplifier means and to one of said oscillators for deriving from the output of said amplifier means a control signal for controlling the frequency of said one of said oscillators so as to maintain said difference frequency substantially constant.

6. A frequency control arrangement as set forth in claim 5, wherein said control circuit means includes a frequency discriminator circuit normally subject to drift during the intervals between pulses, and means for eliminating said drift comprising means coupled to said discriminator for driving the same well below cutoff during the intervals between pulses and placing it in condition to detect during periods of said pulses.

7. A frequency control arrangement as set forth in claim 5, wherein said bandpass amplifier means comprises an overcoupled amplifier.

8. A frequency control arrangement comprising, in combination, a source providing radio frequency pulses the frequency spectrums of which include a center frequency and pluralities of sideband frequencies on opposite sides of said center frequency; circuit means having a passband defined by two selectivity curves, each substantially narrower than the frequency spectrum of the radio frequency pulses, one occurring on one side of said center frequency and the other on the opposite side of said center frequency, said circuit means being coupled to said source for passing, when said center frequency is at a predetermined frequency, sideband frequency components of equal amplitude; and control circuit means coupled to said circuit means and to said source for deriving from the output of said circuit means a control signal for controlling the frequency of said source.

9. A frequency discriminator comprising, in combination, overcoupled amplifier means having a double peaked selectivity curve, one peak tuned to a first frequency component of an input signal and the other peak tuned to a second frequency component of said input signal, the frequencies of said two components being equally spaced from a third frequency component of said input signal; and comparison circuit means coupled to said overcoupled amplifier means for producing a control voltage when signals at said two frequencies passed by said amplifier means are of unequal amplitude.

10. A frequency discriminator comprising, in combination, overcoupled amplifier means connected to receive an input signal having a desired center frequency and a plurality of sideband frequencies, said amplifier means having two spaced selectivity curves, one tuned to a first sideband frequency on one side of said center frequency and the other tuned to a second sideband frequency equally spaced from said center frequency and on the other side thereof; and comparison circuit means coupled to said overcoupled amplifier means for producing a control voltage, when the signal passed through said amplifier means at said first and second frequencies are of unequal amplitude, having a sense and magnitude which are functions of the extent and direction of the departure of said center frequency from the desired center frequency.

11. A frequency discriminator comprising, in combination, overcoupled amplifier means having a double peaked selectivity curve, one peak tuned to a first frequency component of an input signal and the other peak tuned to a second frequency component of said input signal; and comparison circuit means coupled to said overcoupled amplifier means for producing a control voltage, when said two signal components passed by said amplifier means are of unequal amplitude, having a sense and magnitude which are functions of the sense and extent of the difference in amplitudes between said signal components.

References Cited in the file of this patent

UNITED STATES PATENTS

| | | |
|---|---|---|
| 2,686,877 | Lawson | Aug. 17, 1954 |
| 2,713,122 | Henley | July 12, 1955 |